United States Patent
Kao et al.

(10) Patent No.: US 9,081,306 B2
(45) Date of Patent: Jul. 14, 2015

(54) METHOD OF OPTIMIZING LITHOGRAPHY TOOLS UTILIZATION

(71) Applicant: Taiwan Semiconductor Manufacturing Company, Ltd., Hsin-Chu (TW)

(72) Inventors: Yao-Hwan Kao, Baoshan Shiang (TW); Fei-Gwo Tsai, Taipei (TW); Li-Kong Tum, Taichung (TW); Ching-Hai Yang, Taipei (TW); Steven Liu, Pingzhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 479 days.

(21) Appl. No.: 13/622,675

(22) Filed: Sep. 19, 2012

(65) Prior Publication Data

US 2014/0078478 A1    Mar. 20, 2014

(51) Int. Cl.
| | | |
|---|---|---|
| *G03B 27/42* | (2006.01) | |
| *G03B 27/32* | (2006.01) | |
| *G03F 7/20* | (2006.01) | |
| *H01L 21/67* | (2006.01) | |

(52) U.S. Cl.
CPC .............. *G03F 7/70733* (2013.01); *G03F 7/20* (2013.01); *H01L 21/67155* (2013.01)

(58) Field of Classification Search
CPC ..... G03F 7/70799; G03F 7/20; G03F 7/7075; G03F 7/70991; H01L 21/67155; H01L 21/67161; H01L 21/67173
USPC ...................................... 355/53, 77
See application file for complete search history.

(56) References Cited

U.S. PATENT DOCUMENTS 6,697,145 B1 *   2/2004   Aoyama .......................... 355/53
7,959,395 B2 *   6/2011   Hofmeister et al. ........... 414/217

* cited by examiner

*Primary Examiner* — Peter B Kim
(74) *Attorney, Agent, or Firm* — Haynes and Boone, LLP

(57) ABSTRACT

A lithography cluster includes at least two lithography cells having a first lithography cell and a second lithography cell, an interface unit configured to integrate with the first lithography cell and the second lithography cell. The first lithography cell includes a first track and a first exposing tool and a second lithography cell includes a second track and a second exposing tool. The interface station includes a first interface buffer configured to couple the first track, a second interface buffer configured to couple the second track, a conveyor configured to couple the first interface buffer and the second interface buffer, and a robot configure to move along the conveyor, where in the robot transfers a substrate between functions of multiple functions within the first lithography cell, the second lithography cell, or between the first lithography cell and the second lithography cell.

20 Claims, 5 Drawing Sheets

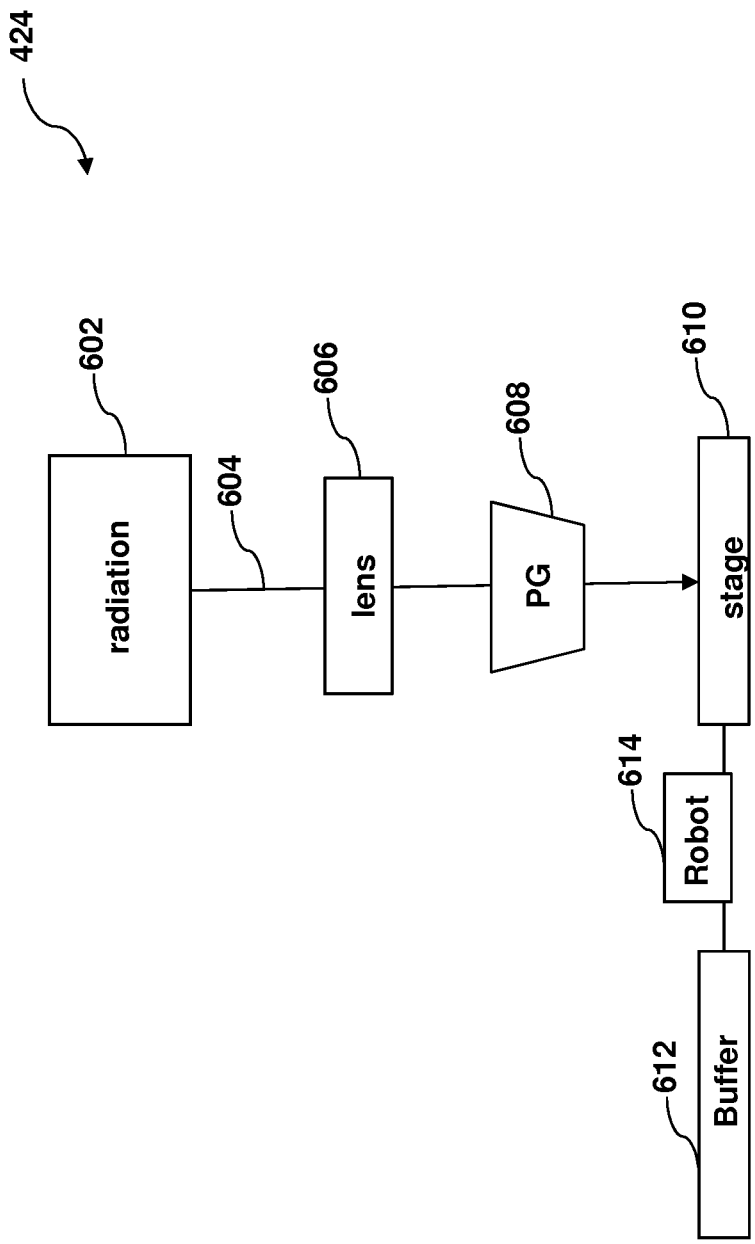

METHOD OF OPTIMIZING LITHOGRAPHY TOOLS UTILIZATION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

For advanced process technology, such as lithography, a multi-function system is often used. For example, an in-line tool referred to as a Track & Scanner is a one-on-one system, in which all products for multiple related processing steps are constrained in the same in-line tool. Continuing with this example, a typical lithography process includes the steps of receiving a substrate (wafer), depositing a resist film on the wafer, exposing the resist film, and developing the exposed resist film to form a patterned image. If, for example, a resist filter and tubing of the system require unexpected maintenance, the overall process may be delayed several hours and even several days, which not only affects all of the wafers in the system, but other wafers scheduled to use the system. In this example, the resist deposition component of the system may be unusable, but other components, such as the exposing component, may be fully functional. The idle time of the exposing tool decreases overall product throughput. Accordingly, what is needed is a method for improving the utilization of the multi-function system.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIG. 5 is a diagram of an exposing tool of a lithography cluster according to one or more embodiments of the present disclosure.

DETAILED DESCRIPTION

Figure 1:
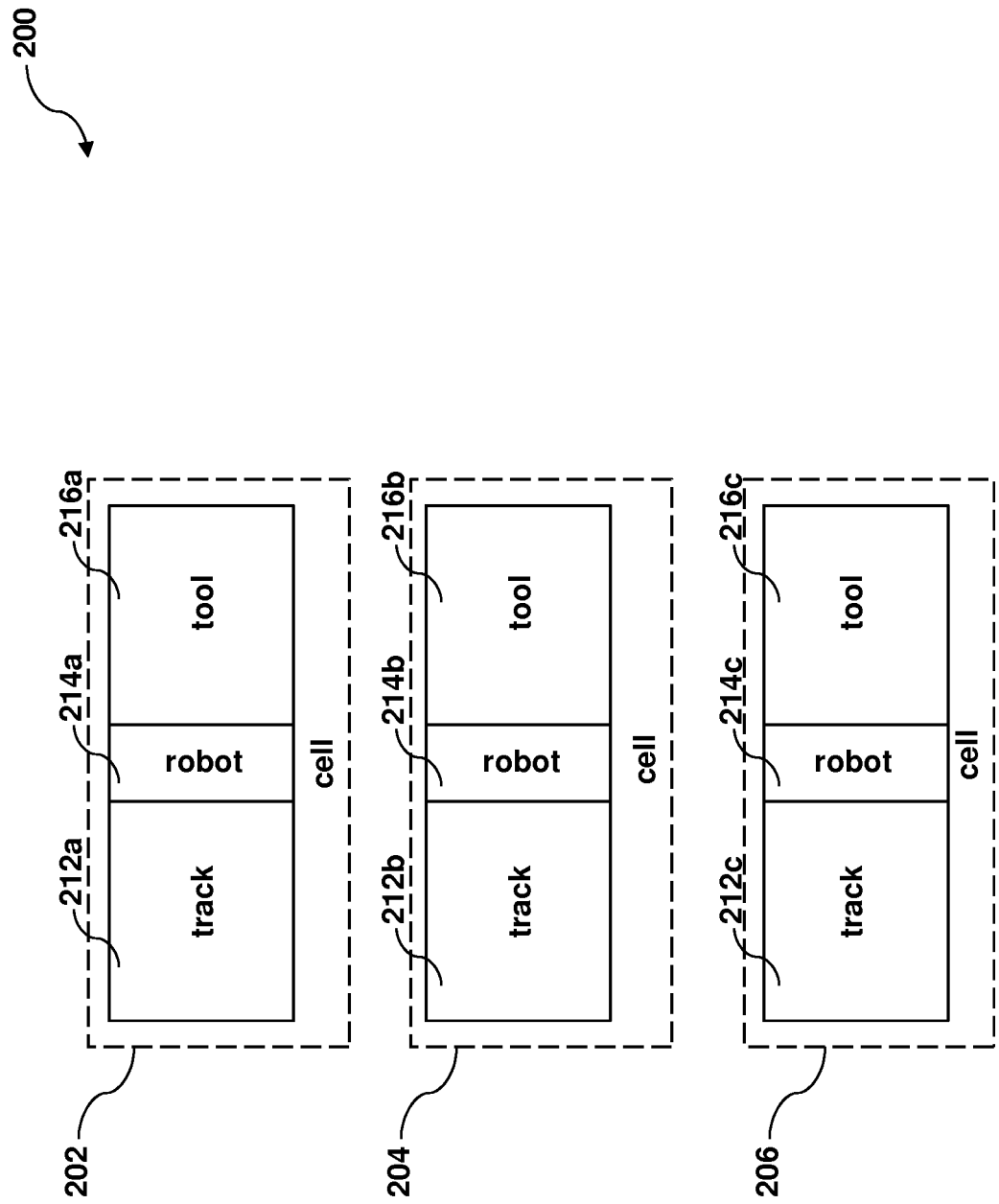
FIG. 1 is a diagram of a lithography cluster according to one or more embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a lithography cluster 200 is an example multi-function system that would benefit from one or more embodiments of the present invention. The lithography cluster 200 includes a first lithography cell 202, a second lithography cell 204, and a third lithography cell 206. The first lithography cell 202 includes a first track 212a, a first robot 214a, and a first exposing tool 216a. The second lithography cell 204 includes a second track 212b, a second robot 214b, and a second exposing tool 216b. The third lithography cell 206 includes a third track 212c, a third robot 214c, and a third exposing tool 216c.

Continuing with the present example, the lithography cluster 200 is used to perform multiple functions, including depositing a resist film on a wafer, exposing the resist film, and developing the exposed film. The steps of depositing the resist film and developing the exposed films are performed on a track; the step of exposing is performed in a tool. A robot picks up a wafer deposited with a resist film from a track, provides the wafer to an exposing tool for exposing the resist film deposited on the wafer, picks up the exposed resist film from the exposing tool, and provides the exposed resist film to the track for developing to form a resist pattern.

Processes of forming a resist pattern, such as depositing a resist film on a wafer, exposing the resist film deposited on the wafer, and developing the exposed the resist film, are performed in a single lithography cell. For example, a wafer is loaded into the first lithography cell 202. A resist film is deposited on the wafer on the first track 212a, then the wafer is transferred to the first exposing tool 216a by the first robot 214a for exposing the resist film. After exposing, the exposed resist film deposited on the wafer is sent to the first track 212a by the first robot 214a for a developing process to form the resist pattern on the wafer.

The tracks, robots, and tools in each of the cells 202, 204, and 206, are configured to perform their conventional processing operations, and include the necessary components to perform these operations as understood by one of ordinary skill in the art. In the lithography cluster example discussed above, the tracks 212a, 212b, and 212c include a reservoir, hose, and nozzle for dispensing resist (also referred to as photoresist). The tracks also include a reservoir, hose, and nozzle for dispensing a developer material. The tools 216a, 216b, and 216c include a wafer stage for securing a wafer, one or more lenses, a mask stage for holding one or more masks, and any step or scanner type motors for the appropriate relative movement between the masks and wafer. In some embodiments, the tools can be an immersion lithography exposure tool and/or a maskless photolithography tool.

As shown in FIG. 1, the first lithography cell 202, the second lithography cell 204, or the third lithography cell 206 are each independent of each other. A wafer can only be processed at one lithography cell at one time. A wafer cannot move between two lithography cells during the overall lithography process. If any component of a lithography cell, such as a track, is down for tool malfunction or maintenance, the whole lithography cell will be idle.

An improved system is herein provided for processing substrates, such as wafers. Consider for example that track 212 of the first lithography cell 202 has a malfunction, such as requiring a filter and tubing replacement need for depositing resist. There are additional wafers in the first lithography cell 202 that have already been deposited with resist, and that require subsequent processing such as exposure and/or developing.

Figure 2:
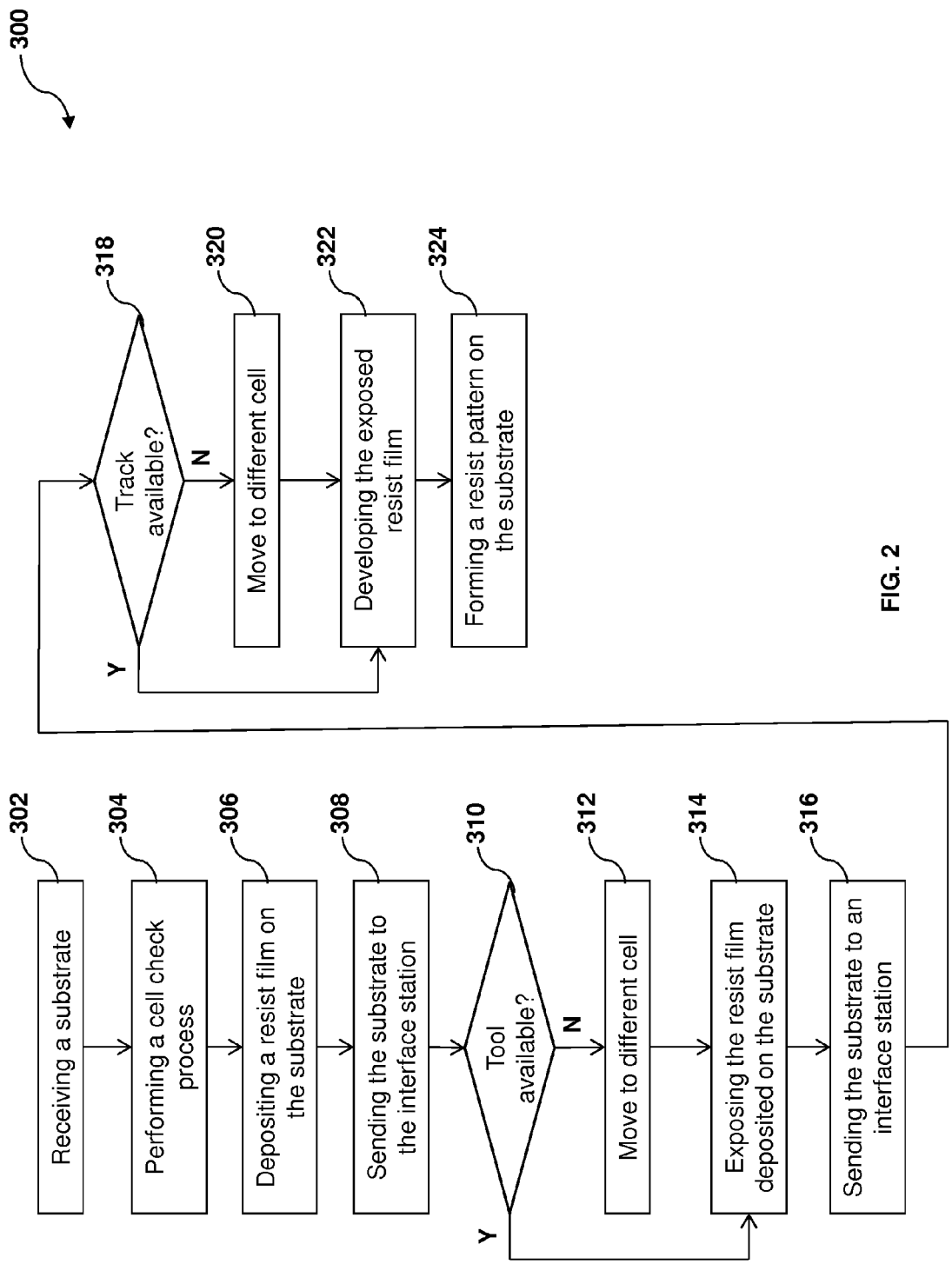
FIG. 2 is a flow chart of a method of forming a resist pattern for improving exposing tool utilization according to one or more embodiments of the present disclosure.
Figure 3:
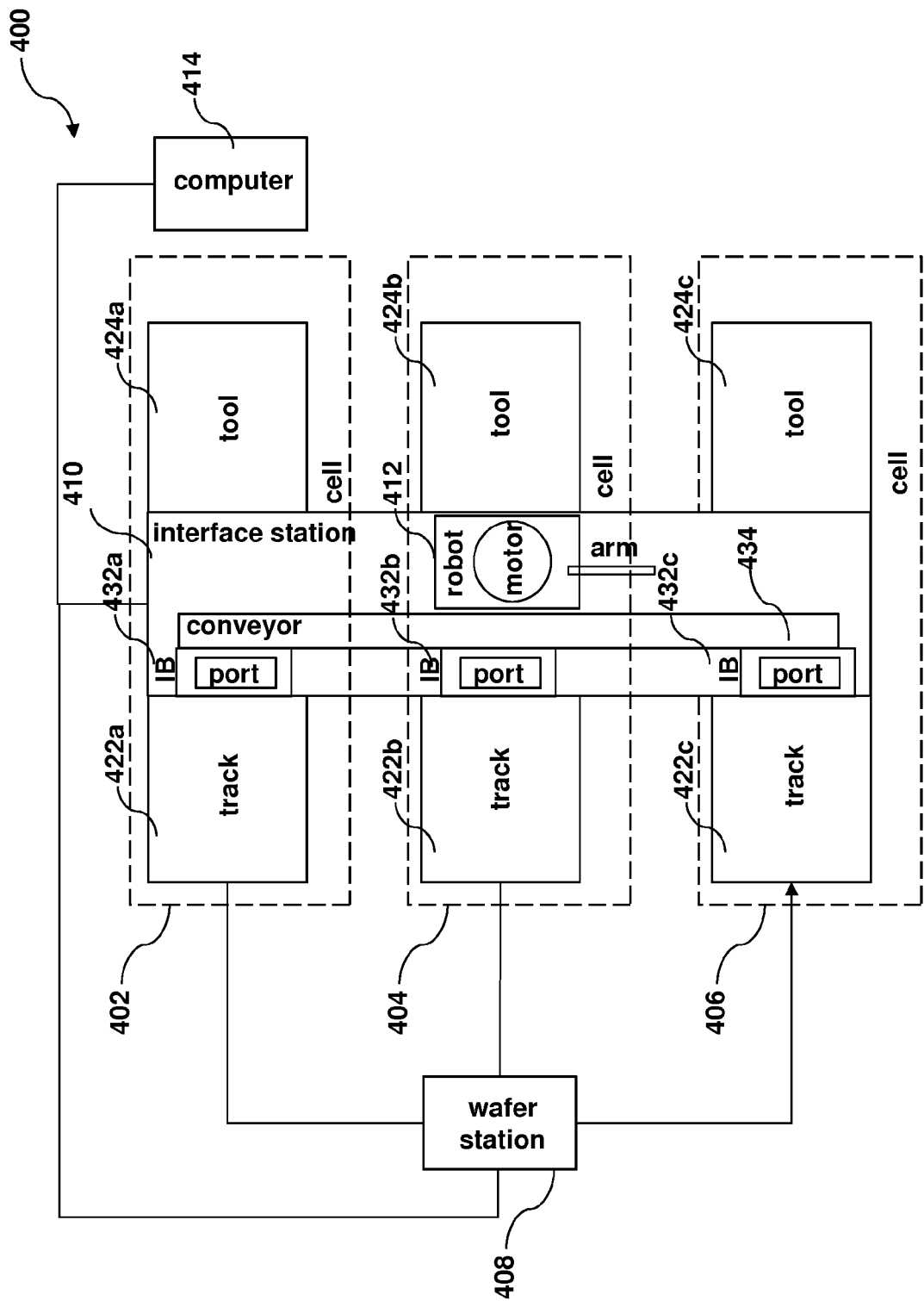
FIG. 3 is a diagram of a lithography cluster with improved exposing tool utilization according to one or more embodiments of the present disclosure.

The following discussion refers to FIGS. 2 and 3 together. FIG. 2 is a flow chart of a method 300 of forming a resist pattern. This method is an example multi-function process that can be performed. Similarly, FIG. 3 is a diagram of a lithography cluster 400 for forming a resist pattern in a semiconductor fab using the method 300. Both the method 300 and the lithography cluster 400 are example embodiments, and are not intended to limit the present invention beyond what is explicitly recited in the claims.

The lithography cluster 400 includes a first lithography cell 402, a second lithography cell 404, and a third lithography cell 406, a wafer station 408, an interface station 410, and a computer 414. The first lithography cell 402 includes a first track 422a and a first exposing tool 424a. The second lithography cell 404 includes a second track 422b and a second exposing tool 424b. The third lithography cell 406 includes a third track 422c and a third exposing tool 424c. In the present embodiments, a lithography cluster is also referred to as a photo cluster and a lithography cell is also referred to as a photo cell. A track is also referred to as a coating tool. The lithography cluster 400 will be discussed in more detail below.

The tracks and tools in each of the cells 402, 404, and 406, are each configured to perform their conventional processing operations, and include the necessary components to perform these operations as understood by one of ordinary skill in the art. This may include processors/controllers, memory, and interfaces to perform conventional functions, as well as to perform functions in accordance with the following disclosure. Modifications and enhancements to the lithography cells 402, 404, and 406 are discussed further below.

Figure 4:
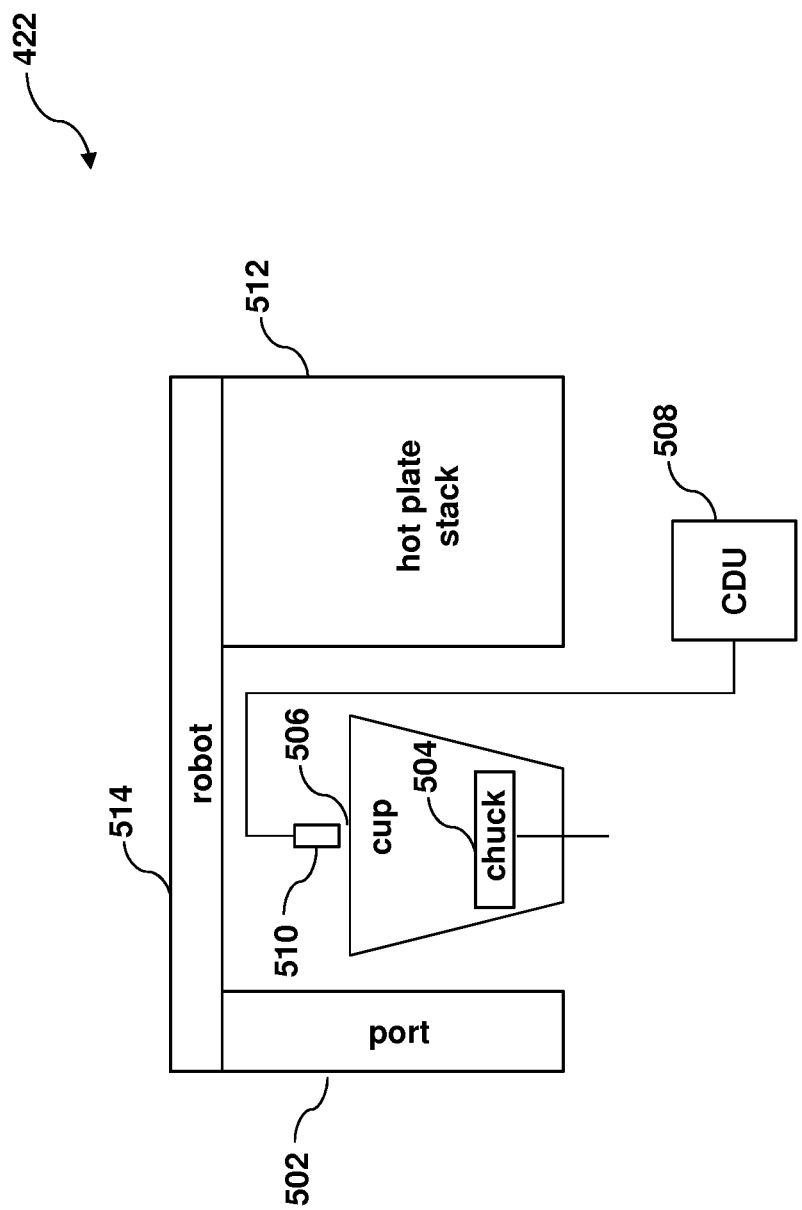
FIG. 4 is a diagram of a track of a lithography cluster according to one or more embodiments of the present disclosure.

Referring also to FIG. 4, a diagram of a track 422 is illustrated for implementing one or more embodiments of the present disclosure. The track 422 is used for depositing a resist film on a wafer as described in step 306 of the method 300 and developing an exposed resist film deposited on the wafer in step 314 of the method 300 with reference to FIG. 2. The track 422 includes a wafer port 502, a chuck 504, a cup 506, a chemical delivery unit 508, a nozzle 510, a hot plate stack 512, and a robot arm 514. However, other configurations and inclusion or omission of the track 200 may be possible.

In the present embodiment, the wafer port 502 includes a wafer boat. The wafer port 502 is configured to send a wafer into the track 422 for a process and receive the wafer after the process. The chuck 504 includes a plate with a plurality of holes. The chuck 504 is connected to a vacuum unit and integrated to a motor. The chuck 504 is configured to secure a wafer and rotate the wafer. The cup 506 includes a plastic cup with a plurality of holes. The cup 506 is connected to an exhausted system. The cup 506 is configured to provide an environment for depositing a resist film on a wafer and developing the exposed resist film deposited on the wafer. The chemical delivery unit 508 includes a tank, a pump, and tubing connecting the tank, the pump and the nozzle 510. The chemical delivery unit 508 may include a filter. The chemical delivery unit 508 is configured to deliver a chemical, such as a resist or a developer from the tank, to a wafer secured on the chuck 504 through the nozzle 510. It is understood that there are different tanks, tubing, etc. for resist and developer. The nozzle 510 includes a plastic, a metal, or a quarts nozzle. The nozzle 510 is configured to distribute a chemical, such a resist or a developer, uniformly on surface of a wafer. The hot plate stack 512 includes a plurality of hot plates. The hot plate stack 512 is configured to heat a wafer deposited with a resist film. The hot plate stack 512 is also configured to perform a dehydration process.

The robot arm 514 is standard arm, configured to move the substrates from one position to another, except as modified in the following disclosure. In the present embodiment, the system is a lithography cluster 400, and the substrates are wafers, so the robot arm 514 is configured accordingly. The robot arm 514 includes a vacuum pen. The robot arm 514 is configured to transfer a wafer in/out and inside the track 422. For example, the robot arm 514 moves a wafer from the wafer port 502 to the chuck 504 for depositing a resist film of the wafer, transfers the wafer deposited with the resist film to the hot plate stack 502 for a soft bake process, and then transfers the wafer bake to the port 502 or to an interface station for an exposing tool.

Referring also to FIG. 5, a diagram of an exposing tool 424 is illustrated for implementing one or more embodiments of the present disclosure. The exposing tool 424 is used for exposing a resist film deposited on a wafer as described in step 310 of the method 300 with reference to FIG. 2. The exposing tool 424 includes an electromagnetic radiation source 602, electromagnetic wave 604, condense lens 606, a pattern generator 608, a stage 610, a buffer station 612, and a robot arm 614. However, other configurations and inclusion or omission of the exposing tool 424 may be possible.

In the present embodiment, the electromagnetic radiation source 602 includes a radiation source providing the electromagnetic wave 604. The electromagnetic wave 604 includes a light in an optical exposing tool. The electromagnetic wave 604 also includes an electron beam in a charged particle lithography tool or an electron beam writer. For example, in an optical exposing tool, the electromagnetic radiation source 602 includes a mercury lamp providing a light with UV wavelength, such as G-line (436 nm) or I-line (365 nm), or a laser providing a light with DUV wavelength, such as 248 nm, 193 nm, or 157 nm, or EUV wavelength at 13.7 nm.

The condense lens 606 includes a plurality of optical lenses in an optical exposing tool or a plurality of electromagnetic lenses in an electron beam writer. The condense lens 606 is configured to guide the electromagnetic wave 604 to the pattern generator 608. In one embodiment of an optical exposing tool, the pattern generator 608 includes a mask. A mask blocks a portion of the electromagnetic wave 604 and provides an aerial image of the electromagnetic wave 604. The pattern generator 608 also includes a plurality of optical objective lenses to guide the aerial image of the electromagnetic wave 604 to a resist film deposited on a wafer secured on the stage 610. In another embodiment of an electron beam writer, the pattern generator 608 includes a plurality of apertures generating a patterned electron beam. The pattern generator 608 also includes a plurality of electromagnetic objective lenses to guide the patterned electron beam to a resist film deposited on a wafer secured on the stage 610. In the present embodiments, a lens may include a transmittance lens or a reflectance lens.

The wafer stage 610 includes motors, roller guides, and tables; secures a wafer by vacuum; and provides accurate position and movement of a wafer in X, Y, and Z directions during alignment, focus, leveling and exposure operations in the exposing tool 424 so that an image of the mask or an image of patterned electron beam is transferred onto the wafer in a repetitive fashion. The buffer station 612 includes a wafer boat and a port securing the wafer boat. The buffer station 612 receives a wafer with a resist film deposited on the wafer and sends the wafer to the wafer stage 610 for exposing the resist film deposited on the wafer. The buffer station 612 also receives an exposed resist film deposited on the wafer and sends the exposed resist film to track for developing the exposed resist film to form a resist pattern on the wafer.

The robot arm 614 in an exposing tool is similar to the robot arm 514 in a track. The robot arm 614 includes a vacuum pen and motors. The robot arm 614 is configured to transfer a wafer from one position to another position in the tool 424. For example, the robot arm 614 picks up a wafer deposited with a resist film from the buffer station 612, provides the wafer to the stage 610 for exposing the resist film deposited on the wafer, picks up the exposed resist film from the stage 610, and provides the exposed resist film to the buffer station 612 for next process, such as developing to form a resist pattern.

The exposing tool 424, or portions thereof, may include additional items, such as a vacuum system, a cooling system and a wafer handling system. In some embodiments, the exposing tool 424 can be an immersion lithography exposure tool and/or a maskless photolithography tool.

The computer 414 is a standard, general-purpose computer, including a processor, memory, and interface. The computer may be a single computer or a distributed computer, and connects to various components of the lithography cluster 400, including but not limited to the connections shown in FIG. 3. The computer 414 includes one or more software programs for making decisions and performing various steps, including one or more steps of the method 300.

The interface station 410 is connected to the computer 414. The interface station 410 is also integrated with the first track 422a, the second track 422b, and the third track 422c. The interface station 410 is further integrated with the first exposing tool 424a, the second exposing tool 424b, and the third exposing tool 424c. The interface station 410 includes the robot arm 412, interface buffers 432a-c, and a conveyor 434. The interface buffers 432a-c are connected to associated tracks 422a-c respectively. The interface buffers 432a-c are designed to provide a place receiving a wafer after finishing a process and sending the wafer therefrom for next process in a multiple function or process system. The interface buffer 432 includes a boat and a port securing the boat. The conveyor 434 is installed inside the interface station 410. The robot arm 412 includes a vacuum pen and a motor. The robot arm 412 moves along the conveyor 434 inside the interface station 410. The robot arm 412 can transfer a wafer from a track to an exposing tool within a lithography cell or between lithography cells for exposing process or transfer a wafer from an exposing tool to a track within a lithography cell or between lithography cells for develop process.

In an example embodiment, when a resist film is deposited on a wafer on the first track 422a, the wafer is sent to the first interface buffer 432a by the robot arm 514. Then the wafer is picked by the robot arm 412 and sent to an exposing tool for exposing process. The wafer may be sent to the exposing tool 424a within the first cell 402, or the wafer may be sent to the second exposing tool 424b or the third exposing tool 424c based on an instruction given by the computer 414, for example, to the third exposing tool 424c for exposing process. The wafer is sent to the buffer 612 by the robot arm 412, is picked from the buffer 512 by the robot arm 614 and is sent to the stage 610 for exposing. After exposing, the exposed wafer is transferred from the stage 610 to the buffer 612 by the robot arm 614 and then transferred to interface buffer 432 by the robot arm 412 for developing process. The exposed wafer may be transferred to a track at same lithography cell or a track at another lithography tool for developing based on an instruction from the computer 414, for example, to the interface buffer 432b. Then the exposed wafer is transferred from the interface buffer 432b to tack 422b for developing.

As shown in FIG. 2, the method 300 begins at step 302 be receiving a substrate. In the present embodiments, a substrate is a semiconductor wafer with zero or more thin films, such as an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride.

The wafer may also include various doped features, such as n-type source/drain, p-type source/drain, n-type wells, and/or p-type wells, formed by ion implantation or diffusion. The wafer may also include includes various isolation features, such as shallow trench isolation (STI). The wafer may also include a gate and a contact hole formed in a front end of line (FEOL) for fabricating a semiconductor IC device. The wafer may also include a plurality of metal lines connecting a gate and a source/drain.

The method 300 proceeds to step 304 by performing a cell check process. Step 304 is performed on the computer 414 with reference to FIG. 3. Step 304 includes assigning checking for various failures in the cell, including in certain components of the cell. Continuing with the present example, the computer 314 and/or a technician, determines if the track and/or exposure tool of a corresponding cell is in working condition. It is noted, for example, that a track may have a malfunction in the resist delivery system, which is requiring maintenance. In this example, the track will also be unavailable for later developing. Step 304 also includes checking the wafer history.

The method 300 proceeds to step 306 by performing a first processing operation on the substrate. Continuing with the present example, step 306 is performed on the first track 422a, the second track 422b, or the third track 424c with reference to FIG. 3. A resist film may include a positive tone resist or a negative tone resist deposited on a wafer, such as by spin-on coating. The resist film may also include a single resist film or a multiple layer photo resist film. Step 306 may include performing a dehydration process before depositing the resist film on the wafer, which can enhance an adhesion of a resist film to a wafer. The dehydration process may include a high temperature baking for a duration of time, or applying a chemical such as hexamethyldisilizane (HMDS) to the wafer. Step 306 also includes applying a bottom anti-reflectance coating (BARC) process to improve profile of a resist pattern. Step 306 includes using a soft bake (SB) process to increase a mechanical strength of the photo resist film.

The method 300 proceeds to step 308 by sending the processed substrate to an interface station. In the present example, step 308 includes receiving the wafer deposited with the resist film in the interface station 410. Step 308 also includes sending the wafer deposited with the resist film to an assigned exposing tool by the robot arm 412. The robot arm 412 may travel among the first lithography cell 402, the second lithography cell 404, and the third lithography cell 406.

The method 300 proceeds to step 310 to determine if the next processing operation can be executed in the current cell. If so, processing will continue in the current cell, if not, execution proceeds to step 312 in which the substrate will be transported to a different cell. Continuing with the present example, the computer 414 checks the availability of the exposing tool 424 for the current cell. If the exposing tool is available, the robot 412 moves the wafer from the track 422 to the tool 424. If the exposing tool of the current cell is not available, at step 312 the computer 414 identifies an available exposing tool of a different cell. In the present embodiments, an assigned exposing tool is also referred to as a predetermined exposing tool.

It is noted that the above-described determinations being performed by the computer 314 are based on availability and operability of the tool or track. In other embodiments, such determinations can be based on different factors, such as backlog or wafer type.

It is also noted that the above described determinations are performed by computer 314. Each of the cells will have one or more computers that not only handle the processing operations to be performed, but will handle the transfer of the substrate from one component to another. The computer 314 can facilitate the movement operations being performed by these one or more computers, or can take over the control of all movement operations. For example, in one embodiment, the robot 412 operates according to standard programming to move a wafer to/from the track 422 and tool 424. The computer 414 can allow this programming to continue as-is if the wafer is to stay in the same cell, and can override this programming if the wafer is to be moved to a different cell. Or, the computer 414 can include programming that controls all of the movement operations.

The method 300 proceeds to step 314 to perform the next process operation. Continuing with the present example, the tool exposes the resist film deposited on the wafer using an assigned or a predetermined exposing process. Step 314 is performed on the first exposing tool 424a, the second exposing tool 424b, or the third exposing tool 424c. The lithography exposing tool includes an ultraviolet (UV) light, a deep ultraviolet (DUV) light, an extreme ultraviolet (EUV), or an X-ray light tool. The lithography exposing tool also includes a charged particle tool, such as an electron beam writer. Step 314 may also include using a mask, such as a binary mask or a phase shift mask (PSM). The phase shift mask may be an alternative phase shift mask (alt. PSM) or an attenuated phase shift mask (att. PSM). In the present disclosure, a mask is also referred to as a photomask or a reticle.

The method 300 proceeds to step 316 by sending the substrate back to the interface station. Continuing with the present example, step 316 includes receiving the wafer with the exposed resist film into the interface station 410.

The method 300 proceeds to step 318 to determine if the next processing operation can be executed in the current cell. If so, processing will continue in the current cell; if not, execution proceeds to step 320 in which the substrate will be transported to a different cell. Step 318 is similar to step 310 discussed above. Continuing with the present example, the computer 414 checks the availability of the track 422 for the current cell. If the track is available, the robot 412 moves the wafer from the tool 424 to the track 422. If the track of the current cell is not available, at step 320, the computer 414 identifies an available track of a different cell. In the present embodiments, an assigned track is also referred to as a predetermined track.

The method 300 proceeds to step 322 to perform the next processing operation. Continuing with the present example, step 322 includes developing the exposed resist film on a track. Step 314 is performed on the first track 422a, the second track 422b, or the third track 424. Step 314 includes applying a developer, such as tetramethylammonium hydroxide (TMAH), on the exposed resist film. It is possible to use an organic solvent as a developer. Step 322 also includes a post exposure bake (PED), a post develop bake (PDB), or both, to improve a profile of a resist pattern. Step 322 also includes a rinsing process to remove a developing residue.

Additional processing steps can also be performed, either in the current cell or in a next processing system. Continuing with the present example, the method 300 proceeds to step 324 in which the wafer is provided to the next processing station for forming a resist pattern on a wafer. The next station may be, for example, an after develop inspection (ADI) station. Step 324 may include assuring no killer defect, such as a pattern bridge, a descum, pattern peeling, pattern underdeveloped, or a particle, existing on the resist pattern formed on the wafer. Step 324 may include a rework if such killer defect is located on the resist pattern. Additional steps can be provided before, during, and after the method 300, and some the steps described can be replaced, eliminated, or moved around for additional embodiments of the method 300.

In the forgoing discussion of the method 300, step 306 for depositing a resist film on a wafer and step 322 for developing an exposed resist film deposited on a wafer can be performed in any available track, such as the first track 422a, the second track 422b, and the third track 422c of the lithography cell 400. Therefore the method 300 improves utilization of an exposing tool. For example, the productivity is improved by more than 20% for a semiconductor device in a lithography cluster having six lithography cells by reducing waiting time for an exposing tool. In one embodiment, because tracks can be shared among exposing tools, it is possible to not install all photo resists on each track and regroup photo resists among tracks. The photo resist regroup may also save resist. For example, photo resist cost is saved by 30% in a lithography cluster by regrouping the photo resists.

Referring back to FIG. 4, the lithography cluster 400 includes the first lithography cell 402, the second lithography cell 404, and the third lithography cell 406, the wafer station 408, the interface station 410, the robot arm 412, and a computer 414. The first lithography cell 402 includes the first track 422a and the first exposing tool 424a. The second lithography cell 404 includes the second track 422b and the second exposing tool 424b. The third lithography cell 406 includes the third track 422c and the third exposing tool 424c.

The wafer station 408 is connected to the first track 422a, the second track 422b, and the third track 422c. The wafer station 408 is also connected to the computer 414. A wafer station is also referred to as a wafer in process (WIP) station. The wafer station 408 receives an instruction from the computer 414 and sends a wafer to the first track 422a, the second track 422b, or the third track 422c installed with a required photo resist.

As shown in FIG. 3, the interface station 410 is connected to the computer 414. The interface station 410 is also integrated with the first track 422a, the second track 422b, and the third track 422c. The interface station 410 is further integrated with the first exposing tool 424a, the second exposing tool 424b, and the third exposing tool 424c. The interface station 410 also includes the robot arm 412. The robot arm 412 moves inside the interface station 410. The robot arm 412 can move and transfer a wafer from one lithography cell to another lithography cell.

The interface station 410 receives a wafer deposited with a resist film from the first track 422a, the second track 422b, or the third track 422c. The interface station 410 also receives an instruction and sends the wafer deposited with the resist film to a predetermined exposing tool of the lithography cluster 400 for exposing the resist film deposited on the wafer. The interface station 410 also receives an exposed resist film deposited on a wafer from the predetermined exposing tool and sends the exposed resist film deposited on the wafer to a track of the lithography cluster 400, such as the first track 422a, the second track 422b, or the third track 422c for developing the exposed resist film deposited on the wafer. It is possible to integrate more tracks and exposing tools in to a lithography cluster as shown in FIG. 3. Thus, the present disclosure describes a lithography cluster. The lithography cluster includes at least two lithography cells having a first lithography cell and a second lithography cell, and an interface unit configured to integrate with the first lithography cell and the second lithography cell. The first lithography cell includes a first track and a first exposing tool and a second lithography cell includes a second track and a second exposing tool. The interface station includes a first interface buffer configured to couple the first track, a second interface buffer configured to couple the second track, a conveyor configured to couple the first interface buffer and the second interface buffer, and a robot configure to move along the conveyor, where in the robot transfers a substrate between functions of multiple functions within the first lithography cell, the second lithography cell, or between the first lithography cell and the second lithography cell.

In some embodiment, a lithography cluster is described. The cluster includes at least two lithography cells having a first lithography cell and a second lithography cell, and an interface unit configured to integrate with the first lithography cell and the second lithography cell so that the interface unit distribute a substrate between functions of the multiple functions within the first lithography cell, the second lithography cell, or between the first lithography cell and the second lithography cell. The first lithography cell includes a first track and a first exposing tool and a second lithography cell includes a second track and a second exposing tool. The interface unit includes a first interface buffer station configured to connect the first track, a second interface buffer station configured to connect the second track, a conveyor configured to connect the first interface buffer station and the second interface buffer station, and a robot configure to move along the conveyor, where in the robot transfers a substrate between functions of multiple functions within the first lithography cell, the second lithography cell, or between the first lithography cell and the second lithography cell.

The present disclosure also describes a method of forming a resist pattern. The method includes receiving a substrate in a lithography cluster for performing multiple functions to form the resist pattern on the substrate having a first lithography cell and second lithography cell and including a predetermined exposing tool, performing a tool check process, depositing a resist film on the substrate, transferring the substrate deposited with the resist film to the predetermined exposing tool using the interface unit, exposing the resist film using the predetermined exposing tool, and developing the exposed resist film. The first lithography cell and the second lithography cell are integrated with an interface unit so that the interface unit transfers the substrate between functions of the multiple functions. Performing the tool check process includes determining availability of the predetermined exposing tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography cluster comprising:
   a first lithography cell including a first track and a first exposing tool;
   a second lithography cell including a second track and a second exposing tool; and
   an interface unit configured to integrate with the first lithography cell and the second lithography cell, wherein the interface unit includes:
   a first interface buffer coupled to the first track;
   a second interface buffer coupled to the second track;
   a conveyor between the first interface buffer and the second interface buffer; and
   a robot system configured to transfer a substrate from the first exposing tool to the conveyor, and from the conveyor to the second track.

2. The cluster of claim 1, further comprising a computer configured to connect to the interface station and control the robot system.

3. The cluster of claim 1, wherein the substrate is a wafer and wherein first interface buffer includes a first port to secure a wafer boat.

4. The cluster of claim 1, wherein the robot system includes two robots, one positioned proximate to the first lithography cell, and the other positioned proximate to the second lithography cell.

5. The cluster of claim 1, wherein the robot includes a vacuum pen to secure the substrate.

6. The cluster of claim 1, wherein the robot system is further configured to transfer a second substrate from the first track to the conveyor, and from the conveyor to the second exposing tool.

7. A system for processing a plurality of substrates, the system comprising:
   a first multifunction tool, including a first interface mechanism for moving a substrate between different functions of the tool;
   a second multifunction tool, including a second interface mechanism for moving a substrate between different functions of the tool;
   an interface unit configured to integrate with the first and second multifunction tools, the interface unit including:
   a first buffer station configured to interact with the first interface mechanism;
   a second buffer station configured to interact with the second interface mechanism; and
   a conveyor configured to connect the first buffer station and the second buffer station;
   a computer for selectively controlling the first and second interface mechanisms, the computer including instructions stored in a recordable medium for:
   executing a first mode of operation, in which a substrate is processed according to the different functions of a single tool; and
   executing a second mode of operation, in which a substrate is processed according to one function of the first tool, and another function of the second tool.

8. The system of claim 7, wherein the first and second multifunction tools are both lithography tools, and wherein the functions including application of photoresist and exposure.

9. The system of claim 7, wherein the first and second interface mechanisms are robots.

10. The system of claim 9, wherein the substrates are wafers, and the robots are configured to move wafers between different portions of the corresponding tool, the different portions corresponding to the different functions of the tool.

11. The system of claim 7, wherein the computer further includes instructions for monitoring mechanical conditions of the first and second tools for performing one or more of the corresponding functions.

12. The system of claim 7, wherein the computer further includes instructions for monitoring capacity conditions of one or more functions of the first and second tools.

13. A method for a performing a sequence of processing operations on a plurality of substrates, the method comprising:
providing a first substrate to a first multifunction tool;
performing the sequence of processing operations on the first substrate, all within the first multifunction tool;
providing a second substrate to the first multifunction tool;
performing a first subset of the sequence of processing operations on the second substrate in the first multifunction tool;
monitoring a status of the first multifunction tool and a second multifunction tool;
automatically interrupting the sequence of processing operations being performed on the second substrate in the first multifunction tool, based on the monitoring;
after performing the first subset of the sequence of processing operations on the second substrate in the first multifunction tool, moving the second substrate to the second multifunction tool;
performing a second subset of the sequence of processing operations on the second substrate in the second multifunction tool.

14. The method of claim 13, wherein the first and second multifunction tools are both lithography tools, and wherein the sequence of processing operations includes applying photoresist on a substrate and exposing a substrate.

15. The method of claim 13, wherein moving the second substrate utilizes a robot.

16. The method of claim 15, wherein the substrates are wafers, and the robot is also configured to move wafers between different portions of the corresponding tool, the different portions corresponding to the different functions of the tool.

17. The method of claim 13, wherein monitoring a status includes monitoring mechanical conditions of the first and second tools for performing one or more of the sequence of processing operations.

18. The method of claim 13, wherein monitoring a status includes monitoring capacity conditions of the first and second tools for performing one or more of the sequence of processing operations.

19. The method of claim 13, wherein automatically interrupting the sequence of processing operations interrupts the sequence between two of the processing operations.

20. The method of claim 13, wherein automatically interrupting the sequence of processing operations includes placing a substrate in a buffer after completion of one processing operation, so that the substrate can be moved.

* * * * *